US011476190B2

(12) United States Patent
Bains et al.

(10) Patent No.: US 11,476,190 B2
(45) Date of Patent: Oct. 18, 2022

(54) FUSE LINES AND PLUGS FOR SEMICONDUCTOR DEVICES

(71) Applicant: Intel Corporation, Santa Clara, CA (US)

(72) Inventors: Balijeet S. Bains, Portland, OR (US); Charles H. Wallace, Portland, OR (US); Zhanping Chen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 16/464,565

(22) PCT Filed: Dec. 30, 2016

(86) PCT No.: PCT/US2016/069532
§ 371 (c)(1),
(2) Date: May 28, 2019

(87) PCT Pub. No.: WO2018/125223
PCT Pub. Date: Jul. 5, 2018

(65) Prior Publication Data
US 2021/0104459 A1  Apr. 8, 2021

(51) Int. Cl.
*H01L 23/52* (2006.01)
*H01L 23/525* (2006.01)
(Continued)

(52) U.S. Cl.
CPC ...... *H01L 23/5256* (2013.01); *H01L 21/0217* (2013.01); *H01L 21/76816* (2013.01); *H01L 23/5283* (2013.01); *H01L 23/532* (2013.01)

(58) Field of Classification Search
CPC ....... H01L 27/11206; H01L 2924/1453; H01L 23/522–53295; H01L 2221/10–1094;
(Continued)

(56) References Cited

U.S. PATENT DOCUMENTS

| 7,692,190 B2 | 4/2010 | Katsuki |
| 2004/0004268 A1 | 1/2004 | Brown et al. |

(Continued)

FOREIGN PATENT DOCUMENTS

WO  WO2015-171147 A1  11/2015

OTHER PUBLICATIONS

International Search Report and Written Opinion dated Sep. 28, 2017 for International Patent Application No. PCT/US2016/069532, 9 pages.

*Primary Examiner* — Moin M Rahman
(74) *Attorney, Agent, or Firm* — Schwabe, Williamson & Wyatt, P.C.

(57) ABSTRACT

Embodiments herein describe techniques for fuse lines and plugs formation. A semiconductor device may include a fuse line having a nominal fuse segment abutted to a necked fuse segment. The nominal fuse segment may be wider than the necked fuse segment. A first spacer may be along a first side of the fuse line and a second spacer along a second side opposite to the first side of the fuse line. The first spacer may include a part having a width at least twice a width of a part of the second spacer. A plug within a vicinity of the necked fuse segment may have a plug width that may be at least twice a plug with of a plug of an interconnect line outside the vicinity. Other embodiments may also be described and claimed.

19 Claims, 11 Drawing Sheets

(51) Int. Cl.
*H01L 21/02* (2006.01)
*H01L 21/768* (2006.01)
*H01L 23/528* (2006.01)
*H01L 23/532* (2006.01)

(58) Field of Classification Search
CPC ......... H01L 21/768–76898; H01L 21/823475; H01L 21/3205–32155; H01L 23/5256; H01L 21/0217; H01L 21/76816; H01L 23/525–5258; H01L 23/5283; H01L 23/532; G11C 17/14–165
See application file for complete search history.

(56) References Cited

U.S. PATENT DOCUMENTS

| | | |
|---|---|---|
| 2007/0252237 A1 | 11/2007 | Ko et al. |
| 2009/0256235 A1* | 10/2009 | Takaoka .............. H01L 23/5256 257/529 |
| 2011/0101460 A1* | 5/2011 | Heinrich ......... H01L 21/823814 257/355 |
| 2013/0134519 A1* | 5/2013 | Sengoku ............. H01L 23/5256 257/364 |
| 2015/0228436 A1* | 8/2015 | Ungar ................... G11C 17/16 337/283 |

* cited by examiner

FUSE LINES AND PLUGS FOR SEMICONDUCTOR DEVICES

CROSS REFERENCE TO RELATED APPLICATIONS

The present application is a national phase entry under 35 U.S.C. § 371 of International Application No. PCT/US2016/069532, filed Dec. 30, 2016, entitled "FUSE LINES AND PLUGS FOR SEMICONDUCTOR DEVICES", which designated, among the various States, the United States of America. The Specification of the PCT/US2016/069532 Application is hereby incorporated by reference.

FIELD

Embodiments of the disclosure are in the field of semiconductor devices and processing and, in particular, fuse lines and plugs formation for back end of line (BEOL) interconnects.

BACKGROUND

A semiconductor device, or simply a device, may be electrically coupled by conductive interconnect structures, which may include interconnect lines distributed in various levels above a substrate. Sometimes, interconnect lines may be referred to as metal lines, conductive lines, conductive traces, or simply traces. Interconnect lines distributed in different levels may be coupled to one another by vias. On the other hand, interconnect lines on a same level may be separated by dielectric lines, e.g., spacers. In addition, an interconnect line may be interrupted by non-conductive spaces or interruptions, referred to as line ends, plugs, or cuts. The plugs may be nonconductive (dielectric) spaces or interruptions that break a continuous interconnect line into multiple segments at a given level. A semiconductor device may also include fuse lines, which may be a sacrificial device employed to provide overcurrent protection for the semiconductor device. A fuse line may have a low resistance and may create a permanently non-conductive path when the current across the semiconductor device exceeds a certain level. Sometimes, a fuse line may include a weak link along the fuse line to expedite fuse programming while maintaining overall reliability of the semiconductor device. However, such a weak link may create shorts around the weak link of the fuse line once the fuse line is blown, which may compromise the integrity of the semiconductor device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
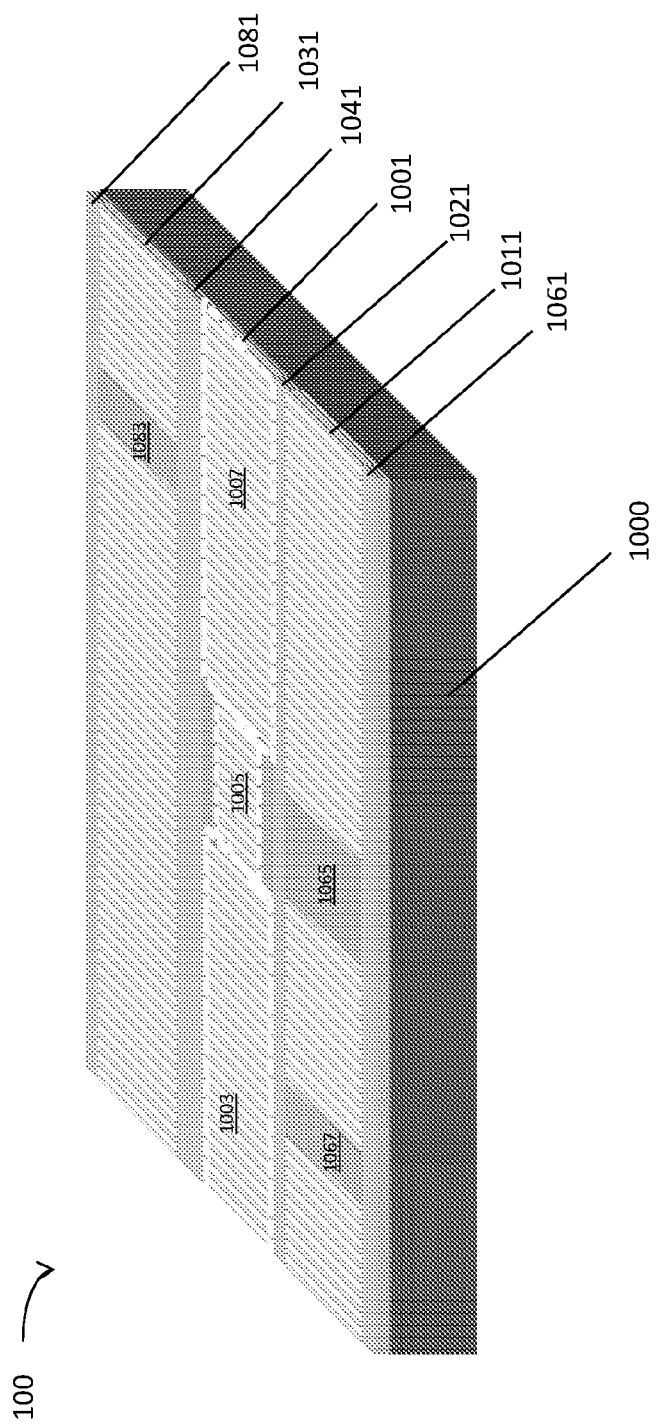
FIG. 1 schematically illustrates a three-dimensional view of an example semiconductor device including plugs and a fuse line separated from other interconnect lines by spacers, in accordance with some embodiments.

In accordance with some embodiments described further below, a semiconductor device may include a fuse line separated from other interconnect lines by spacers. A fuse line may include a weak link along the fuse line which may blow (e.g., form a high resistance path (open circuit)) when the current across the fuse line exceeds a certain level. The weak link may be referred to as the necked fuse segment, and other parts of the fuse line may be referred to as nominal fuse segments. In embodiments, a spacer next to the fuse line may have a width larger than other spacers. A wider spacer next to the fuse line may provide better separation between the fuse line and other interconnect lines, hence preventing potential shorts around the necked fuse segment of the fuse line once the fuse line is blown. An interconnect line may be broken into multiple segments by plugs. In embodiments, the plugs within a vicinity of the necked fuse segment of the fuse line may be wider than plugs in other interconnect lines in the semiconductor device. With wider spacer around the fuse line and/or wider plugs within the vicinity of the necked fuse segment of the fuse line, embodiments herein may maintain the integrity of the semiconductor device once the fuse line is blown around the necked fuse segment.

In embodiments, a semiconductor device may include a fuse line disposed over a substrate, where the fuse line may include a nominal fuse segment abutted to a necked fuse segment. The nominal fuse segment may have a nominal lateral width, and the necked fuse segment may have a necked lateral width that is smaller than the nominal lateral width. In addition, the semiconductor device may include a first spacer along a first side of the fuse line and a second spacer along a second side opposite to the first side of the fuse line. The first spacer may include a first part of the first spacer that is next to the nominal fuse segment, and the second spacer may include a first part of the second spacer that is next to the nominal fuse segment. The first part of the first spacer may have a first width, the first part of the second spacer may have a second width, and the second width may be at least twice the first width.

In embodiments, a semiconductor device may include a fuse line disposed over a substrate, where the fuse line may include a nominal fuse segment abutted to a necked fuse segment. The nominal fuse segment may have a nominal lateral width, and the necked fuse segment may have a necked lateral width that is smaller than the nominal lateral width. In addition, the semiconductor device may include a first spacer along a first side of the fuse line and a second spacer along a second side opposite to the first side of the fuse line. The first spacer may include a first part of the first spacer that is next to the nominal fuse segment, and the second spacer may include a first part of the second spacer that is next to the nominal fuse segment. The semiconductor device may further include a first plug of an interconnect line in parallel with the fuse line, and a second plug next to the first spacer or the second spacer, and at least a part of the second plug is located orthogonal to the necked fuse segment of the fuse line. The first plug may have a first plug width, and the second plug may have a second plug width that is at least twice the first plug width.

In embodiments, a method for fabricating a fuse structure in a semiconductor device may include patterning a first mandrel line and a second mandrel line in parallel to the first mandrel line disposed over a substrate. The first mandrel line and the second mandrel line may form a narrower space, and a wider nominal space abutted to the narrower space. The method may further include forming a first spacer along edges of the first mandrel line, and forming a second spacer along edges of the second mandrel line. The first spacer may include a first spacer segment disposed within the nominal space and a second spacer segment disposed within the narrower space, where the first spacer segment and the second spacer segment have a first lateral width. The second spacer may include a third spacer segment disposed within the nominal space and a fourth spacer segment disposed within the narrower space, and the third spacer segment and the fourth spacer segment have a second lateral width that is at least twice the first lateral width. The method may further include removing the first mandrel line selectively from the first spacer and removing the second mandrel line selectively from the second spacer. In addition, the method may include forming a fuse line between the first spacer and the second spacer. The fuse line may include a nominal fuse segment within the nominal space and a necked fuse segment within the narrower space.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and oxygen-containing metal alloys such as conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbon-containing metal alloys such as metal carbides of these metals, for example hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from materials such as silicon, nitrogen, carbon, and oxygen, for example silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. The dielectric materials may contain elements such as silicon, oxygen, carbon, nitrogen, fluorine, and hydrogen. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a three-dimensional view of an example semiconductor device 100 including plugs, e.g., a plug 1065, a plug 1067, and a plug 1083, and a fuse line, e.g., a fuse line 1001, separated from other interconnect lines, e.g., an interconnect line 1011, and an interconnect line 1031, by spacers, e.g., a spacer 1021, a spacer 1041, a spacer 1061, and a spacer 1081, in accordance with some embodiments.

In embodiments, the semiconductor device 100 may include a substrate 1000. Multiple interconnect lines, e.g., the interconnect line 1011 and the interconnect line 1031, may be disposed over the substrate 1000, in parallel with the fuse line 1001. The plug 1065 and the plug 1067 may interrupt the interconnect line 1011, while the plug 1083 may interrupt the interconnect line 1031. The fuse line 1001, the interconnect line 1011, and the interconnect line 1031 may be separated by dielectric material, e.g., the spacer 1021, the spacer 1041, the spacer 1061, and the spacer 1081. Furthermore, the fuse line 1001 may include a necked fuse segment 1005, a nominal fuse segment 1003, and a nominal fuse segment 1007. The nominal fuse segment 1003 and the nominal fuse segment 1007 abutted to the necked fuse segment 1005 may be wider than the necked fuse segment 1005. Hence, the necked fuse segment 1005 may be a weak link of the fuse line 1001.

In embodiments, the substrate 1000 may be any substrate suitable for a monolithically integrated electrical, optical, or micro-electromechanical (MEM) device, generally referred to herein as a semiconductor device, or a device. Exemplary substrates may include a semiconductor substrate, semiconductor-on-insulator (SOI) substrate, an insulator substrate (e.g., sapphire), or other substrate. In one exemplary embodiment, the substrate 1000 may include a substantially monocrystalline semiconductor, such as, but not limited to, silicon.

In embodiments, active devices, not depicted, such as transistors, photodetectors, lasers, memory cells, and the like may be disposed in or on the substrate 1000. One or more passive device, such as resistors, capacitors, inductors, optical waveguides, or the like may also be disposed in or on the substrate 1000.

In embodiments, the interconnect line 1011 and the interconnect line 1031 may include any conductive material suitable for a semiconductor device. For example, the interconnect line 1011 and the interconnect line 1031 may include doped polysilicon. In other embodiments, the interconnect line 1011 and the interconnect line 1031 may be metallized and may include one or more of copper (Cu), Tungsten (W), aluminum (Al), titanium OR, platinum (Pt), cobalt (Co), tantalum (Ta), an alloy of Cu, W, Al, Ti, Pt, Co, or Ta, or other conductive material.

The fuse line 1001 may include the necked fuse segment 1005, the nominal fuse segment 1003, and the nominal fuse segment 1007. The necked fuse segment 1005 may have a necked lateral width, while the nominal fuse segment 1003 and the nominal fuse segment 1007 may have a nominal lateral width that is larger than the necked lateral width. The necked fuse element 1005 may blow when the current across the fuse line 1001 exceeds a certain level. The fuse line 1001 may include one or more of copper (Cu), Tungsten (W), aluminum (Al), titanium (Ti), platinum (Pt), cobalt (Co), tantalum (Ta), an alloy of Cu, W, Al, Ti, Pt, Co, or Ta, or other conductive material.

In embodiments, the spacer 1021, the spacer 1041, the spacer 1061, and the spacer 1081 may include any dielectric material known in the art to be suitable for electrically isolating the fuse line 1001, the interconnect line 1011, and the interconnect line 1031 from each other. Many materials may be in use in the art, such as, but not limited to, silicon dioxide ($SiO_2$), silicon nitride ($Si_3N_4$), silicon oxynitride (SiON), a low-k material, or an ultra low-k material. A low-k material may be a material with a small dielectric constant relative to silicon dioxide, such as fluorine-doped silicon dioxide, carbon-doped silicon dioxide, or porous silicon dioxide. An ultra low-k material may have a dielectric constant even smaller than the low-k material. An ultra low-k material may include carbon doped silicon dioxide/nitride, or porous dielectrics. The spacer 1041 next to the fuse line 1001 may be wider than other spacers, e.g., the spacer 1021, or the spacer 1061, so that when blown, the fuse line 1001 would not create a potential short around the necked fuse segment 1005, e.g., not to create a short for the interconnect line 1031.

The plug 1065, the plug 1067, and the plug 1083 may interrupt the interconnect line 1011 or the interconnect line 1031. The plug 1065 may be within a vicinity of the necked fuse segment 1005, e.g., at least a part of the plug 1065 is located orthogonal to the necked fuse segment 1005. Other plugs, e.g., the plug 1067 and the plug 1083, may not be within the vicinity of the necked fuse segment 1005. The plug 1065 may be wider than the plug 1067 and the plug 1083. Hence, when blown, the fuse line 1001 would not create a potential short around the necked fuse segment 1005, e.g., not to create a short for the interconnect line 1011.

Figure 2:
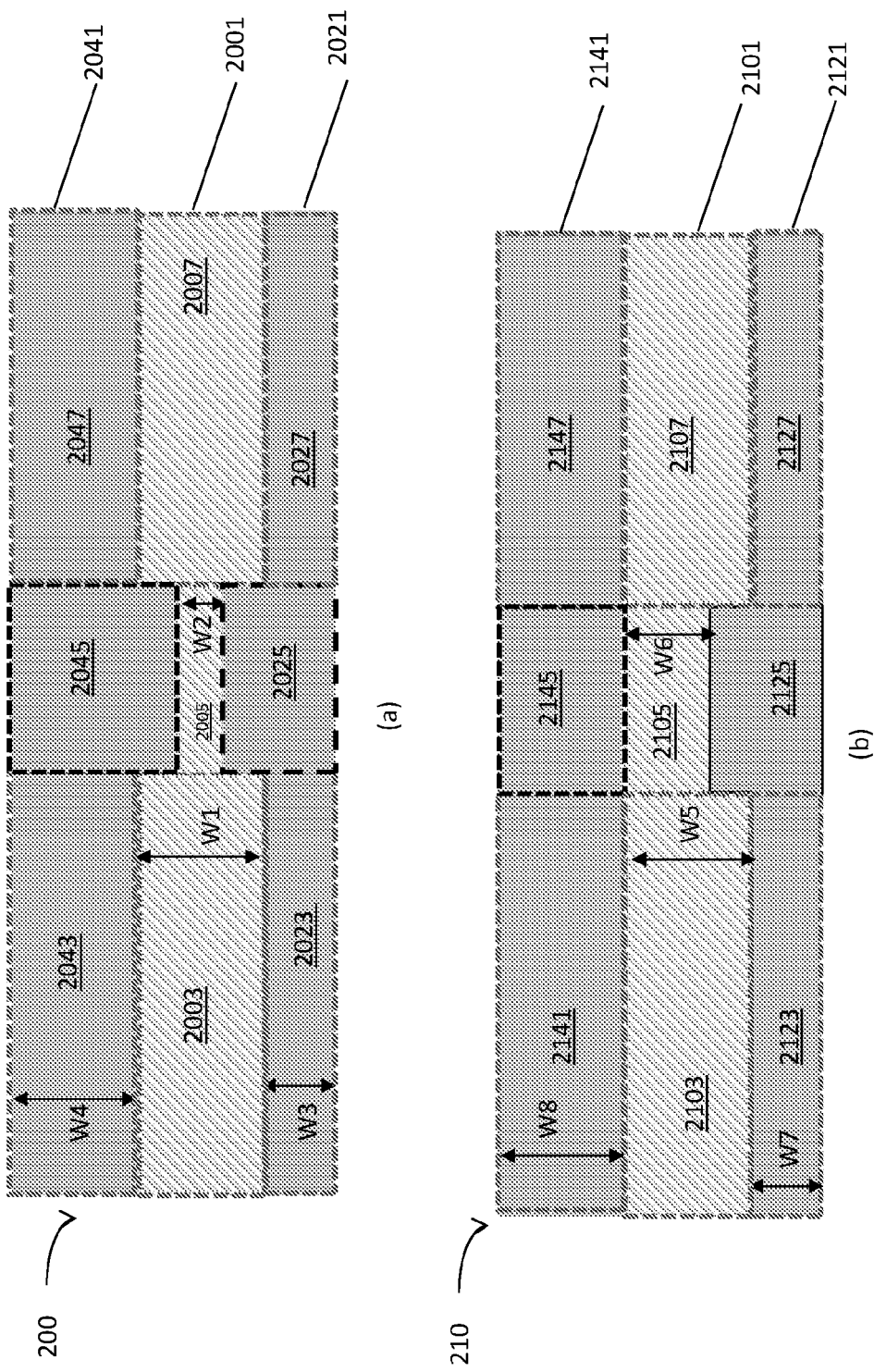
FIGS. 2(a)-2(b) schematically illustrate top-down views of example semiconductor devices including a fuse line having a nominal fuse segment and a necked fuse segment between two spacers, in accordance with some embodiments.

FIGS. 2(*a*)-2(*b*) schematically illustrate top-down views of example semiconductor devices, e.g., a device 200 or a device 210, including a fuse line, e.g., a fuse line 2001 or a fuse line 2101, having a nominal fuse segment and a necked fuse segment between two spacers, in accordance with some embodiments. The device 200 or the device 210 may be an example of the device 100 shown in FIG. 1, where the fuse line 2001 or the fuse line 2101 may be an example of the fuse line 1001.

FIG. 2(*a*) illustrates a top-down view of the device 200 having the fuse line 2001. A spacer 2021 may be next to the fuse line 2001 along a first side of the fuse line 2001, and a spacer 2041 may be next to the fuse line 2001 along a second side of the fuse line 2001 opposite to the first side of the fuse line 2001 where the spacer 2021 is located. The spacer 2021, the spacer 2041, and the fuse 2001 may together form a rectangle in top-down view.

The fuse line 2001 may include a necked fuse segment 2005, a nominal fuse segment 2003, and a nominal fuse segment 2007. The necked fuse segment 2005, the nominal fuse segment 2003, and the nominal fuse segment 2007 may each be a rectangle. The nominal fuse segment 2003 and the nominal fuse segment 2007 may be abutted to the necked fuse segment 2005. The nominal fuse segment 2003 or the nominal fuse segment 2007 may have a nominal lateral width W1, and the necked fuse segment 2005 may have a necked lateral width W2 that is smaller than the nominal lateral width W1. In embodiments, the nominal lateral width W1 may be equal to a critical dimension, e.g., a minimal feature size, for an interconnect line based on a design rule. In embodiments, the necked lateral width W2 may be in a range of 90% to 25% of the nominal lateral width W1.

The spacer 2021 may include a first part 2023 next to the nominal fuse segment 2003, a second part 2025 next to the necked fuse segment 2005, and a third part 2027 next to the nominal fuse segment 2007. The first part 2023 and the third part 2027 may have a width W3. In some embodiments, the necked fuse segment 2005 may be located around the middle edge of the nominal fuse segment 2003, so that the second part 2025 may be wider than the first part 2023 or the third part 2027.

The spacer 2041 may include a first part 2043 next to the nominal fuse segment 2003, a second part 2045 next to the necked fuse segment 2005, and a third part 2047 next to the nominal fuse segment 2007. The first part 2043 and the third part 2047 may have a width W4. In some embodiments, the necked fuse segment 2005 may be located around the middle edge of the nominal fuse segment 2003, so that the second part 2045 may be wider than the first part 2043 or the third part 2047.

In embodiments, the width W4 of the first part 2043 of the spacer 2041 may be at least twice the width W3 of the first part 2023 of the spacer 2021. In some embodiments, the width W4 may be exactly twice the width W3, which may be more efficient to be formed. In some other embodiments, the width W4 may be substantially around twice the width W3, with a slight variation due to manufacturing variation (e.g., +/−10% of 2×). In further embodiments, the width W4 may be three times or more the width W3. In some other embodiments, it may be the case that the width W3 of the first part 2023 of the spacer 2021 may be at least twice the width W4 of the first part 2043 of the spacer 2041.

FIG. 2(b) illustrates a top-down view of the device 210 having the fuse line 2101. A spacer 2121 may be next to the fuse line 2101 along a first side of the fuse line 2101, and a spacer 2141 may be next to the fuse line 2101 along a second side of the fuse line 2101 opposite to the first side of the fuse line 2101 where the spacer 2121 is located. The spacer 2121, the spacer 2141, and the fuse 2101 may together form a rectangle in top-down view.

The fuse line 2101 may include a necked fuse segment 2105, a nominal fuse segment 2103, and a nominal fuse segment 2107. The necked fuse segment 2105, the nominal fuse segment 2103, and the nominal fuse segment 2107 may each be a rectangle. The nominal fuse segment 2103 or the nominal fuse segment 2107 may have a nominal lateral width W5, and the necked fuse segment 2105 may have a necked lateral width W6 that is smaller than the nominal lateral width W5. In embodiments, the nominal lateral width W5 may be equal to a critical dimension, e.g., a minimal feature size, for an interconnect line based on a design rule. In embodiments, the necked lateral width W6 may be in a range of 90% to 25% of the nominal lateral width W5.

The spacer 2121 may include a first part 2123 next to the nominal fuse segment 2103, a second part 2125 next to the necked fuse segment 2105, and a third part 2127 next to the nominal fuse segment 2107. The first part 2123 and the third part 2127 may have a width W7. In some embodiments, the necked fuse segment 2105 may be aligned with one edge, e.g., an edge next to the spacer 2141, of the nominal fuse segment 2103 or the nominal fuse segment 2107, so that the second part 2125 may be wider than the first part 2123 or the third part 2127.

The spacer 2141 may include a first part 2143 next to the nominal fuse segment 2103, a second part 2145 next to the necked fuse segment 2105, and a third part 2147 next to the nominal fuse segment 2107. The first part 2143 and the third part 2147 may have a width W8. In some embodiments, the necked fuse segment 2105 may be aligned with one edge, e.g., an edge next to the spacer 2141, of the nominal fuse segment 2103 or the nominal fuse segment 2107, so that the second part 2145 may be of a same width as the first part 2143 or the third part 2147.

In embodiments, the width W8 of the first part 2143 of the spacer 2141 may be at least twice the width W7 of the first part 2123 of the spacer 2121. In some other embodiments, it may be the case that the width W7 of the first part 2123 of the spacer 2121 may be at least twice the width W8 of the first part 2143 of the spacer 2141.

Figure 3:
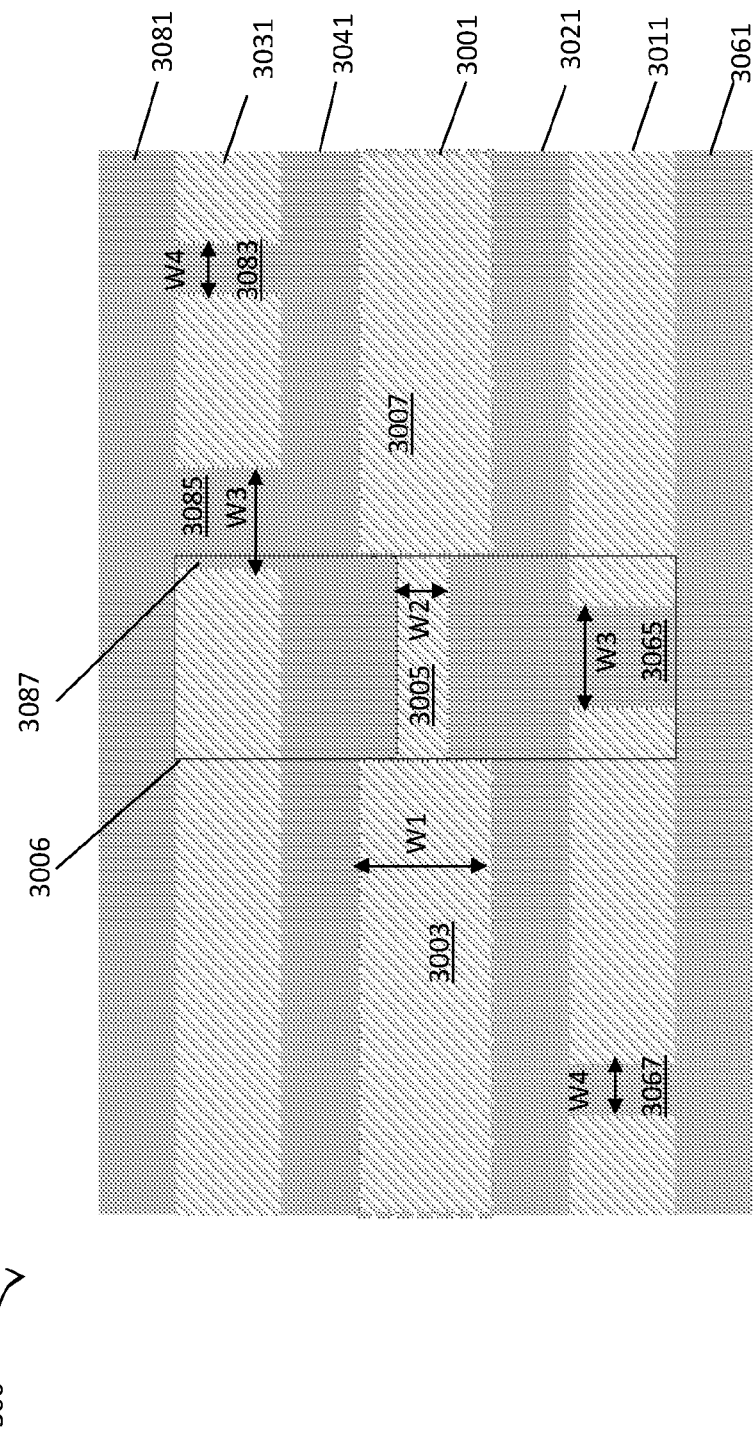
FIG. 3 schematically illustrates a top-down view of an example semiconductor device including multiple plugs and a fuse line having a nominal fuse segment and a necked fuse segment between two spacers, in accordance with some embodiments.

FIG. 3 schematically illustrates a top-down view of an example semiconductor device 300 including plugs, e.g., a plug 3065, a plug 3067, a plug 3083, and a plug 3085, and a fuse line, e.g., a fuse line 3001, having a nominal fuse segment and a necked fuse segment between two spacers, e.g., a spacer 3021 and a spacer 3041, in accordance with some embodiments. The device 300 may be an example of the device 100 shown in FIG. 1, where the fuse line 3001 may be an example of the fuse line 1001.

In embodiments, the device 300 may include the fuse line 3001. The spacer 3021 may be next to the fuse line 3001 along a first side of the fuse line 3001, and the spacer 3041 may be next to the fuse line 3001 along a second side of the fuse line 3001 opposite to the first side of the fuse line 3001 where the spacer 3021 is located. The spacer 3021, the spacer 3041, and the fuse 3001 may together form a rectangle in top-down view. In addition, an interconnect line 3031 and an interconnect line 3011 may be separated from the fuse line 3001 by the spacer 3021 or the spacer 3041, respectively, and further separated from other interconnect lines by a spacer 3061 or a spacer 3081. The interconnect line 3011 and the interconnect line 3031 may be in parallel to the fuse line 3001.

The fuse line 3001 may include a necked fuse segment 3005, a nominal fuse segment 3003, and a nominal fuse segment 3007. The necked fuse segment 3005, the nominal fuse segment 3003, and the nominal fuse segment 3007 may each be a rectangle. The nominal fuse segment 3003 and the nominal fuse segment 3007 may be abutted to the necked fuse segment 3005. The nominal fuse segment 3003 or the nominal fuse segment 3007 may have a nominal lateral width W1, and the necked fuse segment 3005 may have a necked lateral width W2 that is smaller than the nominal lateral width W1. In embodiments, the nominal lateral width W1 may be equal to a critical dimension for an interconnect line based on a design rule. In embodiments, the necked lateral width W2 may be in a range of 90% to 25% of the nominal lateral width W1.

The plug 3065 and the plug 3067 may interrupt the interconnect line 3011 so that the interconnect line 3011 may be broken into multiple segments. Similarly the interconnect line 3031 may be broken into multiple segments by the plug 3083 and the plug 3085. The plug 3065, the plug 3067, the plug 3083, and the plug 3085 may include a same material for the spacer 3021 or the spacer 3041.

The plug 3065 may be within a vicinity 3006 of the necked fuse segment 3005. In embodiments, the vicinity 3006 may refer to an area that overlaps with the necked fuse segment 3005 along a direction orthogonal to the necked fuse segment 3005. The plug 3065 may be entirely contained within the vicinity 3006. As another example, the plug 3085 may have a part 3087 contained within the vicinity 3006, where the plug 3085 may be within the vicinity 3006. On the other hand, the plug 3067 and the plug 3083 may be completely off the vicinity 3006. In some other embodiments, the vicinity 3006 may be an area surrounding the necked fuse segment 3005, formed by a design rule based on the technology used to fabrication the device 300, and/or the application the device 300 may be used for.

In embodiments, the plug 3065 and the plug 3085, which are next to the spacer 3021 or the spacer 3041, and within the vicinity 3006, may have a width W3. The plug 3067 and the plug 3083, which are completely out of the vicinity 3006, may have a width W4. The width W3 may be at least twice the width W4. Hence, plugs within the vicinity 3006 may be wider than plugs outside the vicinity 3006, to provide better protection to the interconnect line 3011 or the interconnect line 3031 around the necked fuse segment 3005.

FIGS. 4(a)-4(e) schematically illustrate a process 400 for forming an example semiconductor device 410 including multiple fuse lines, e.g., a fuse line 4001, and a fuse line 4101, having a nominal fuse segment, e.g., a nominal fuse segment 4003, a nominal fuse segment 4103, and a necked fuse segment, e.g., a necked fuse segment 4005, a necked fuse segment 4105, between spacers, e.g., a spacer 4021, a spacer 4041, a spacer 4121, a spacer 4141, in accordance with some embodiments. The process 400 may illustrate the formation of the fuse line 1001, the spacer 1021, and the spacer 1041 for the device 100 shown in FIG. 1. Similarly, the process 400 may illustrate the formation of the fuse line 2001, the spacer 2021, and the spacer 2041 for the device 200 shown in FIG. 2(a).

As shown in FIG. 4(a), a mandrel line 4201, a mandrel line 4203, and a mandrel line 4205 may be patterned, where the mandrel line 4201, the mandrel line 4203, and the mandrel line 4205 may be in parallel. Furthermore, the mandrel line 4201, the mandrel line 4203, and the mandrel line 4205 may be disposed over a substrate, not shown.

The mandrel line 4201 and the mandrel line 4203 may form a narrower space 4305 with a width W2, a nominal space 4303 abutted to the narrower space 4305, and a nominal space 4307 abutted to the narrower space 4305. The nominal space 4303 and the nominal space 4307 may have a width W1 that is wider (larger) than the width W2 of the narrower space. In addition, the mandrel line 4201 and the mandrel line 4203 may have a width W3 at the segments that form the nominal space 4303 and the nominal space 4307.

The mandrel line 4205 may include a necked part 4315, a nominal part 4313 abutted to the necked part 4315, and a nominal part 4317 abutted to the necked part 4315. The nominal part 4313 and the nominal part 4317 may have a nominal lateral width W3, which may be the same width as the segments of the mandrel line 4201 and the mandrel line 4203. In addition, the necked part 4315 may have a necked lateral width W4 that is smaller than the nominal lateral width W3.

As shown in FIG. 4(b), a spacer 4081, a spacer 4041, a spacer 4021, a spacer 4061, a spacer 4141, and a spacer 4121 may be formed around the mandrel line 4201, the mandrel line 4203, and the mandrel line 4205, respectively. The spacer 4081, the spacer 4041, the spacer 4021, the spacer 4061, the spacer 4141, and the spacer 4121 may include one or more of silicon dioxide ($SiO_2$), silicon nitride ($Si_3N_4$), silicon oxynitride (SiON), a low-k material, or an ultra low-k material.

The spacer 4041 may be formed along edges of the mandrel line 4201. The spacer 4041 may include a spacer segment 4043 disposed within the nominal space 4303, a spacer segment 4045 disposed within the narrower space 4305, and a spacer segment 4047 disposed within the nominal space 4307. The spacer segment 4043, the spacer segment 4045, and the spacer segment 4047 may have a lateral width W5.

The spacer 4021 may be formed along edges of the mandrel line 4203. The spacer 4021 may include a spacer segment 4023 disposed within the nominal space 4303, a spacer segment 4025 disposed within the narrower space 4305, and a spacer segment 4027 disposed within the nominal space 4307. The spacer segment 4023, the spacer segment 4025, and the spacer segment 4027 may have a lateral width W6. In embodiments, the lateral width W5 may be the same as the lateral width W6.

In addition, an empty space 4401 may be formed between the spacer 4041 and the spacer 4021. The empty space 4401 may include the remaining space of the nominal space 4303, the remaining space of the narrower space 4305, and the remaining space of the nominal space 4307, after being used for the spacer 4041 and the spacer 4021. The remaining space of the nominal space 4303 after being used for the spacer segment 4043, and the spacer segment 4023 may have a width W9. Similarly, the remaining space of the nominal space 4307 after being used for the spacer segment 4047, and the spacer segment 4027 may have a same width W9. The remaining space of the nominal space 4305 after being used for the spacer segment 4045, and the spacer segment 4025 may have a width W10, which is smaller than the width W9.

The spacer 4141 may be formed along edges of the mandrel line 4205 on a first side. The spacer 4141 may include a spacer segment 4143 next to the nominal part 4313, a spacer segment 4145 next to the necked part 4315, and a spacer segment 4147 next to the nominal part 4317. The spacer segment 4143 and the spacer segment 4147 may have a lateral width W7. The spacer segment 4145 may be wider than the lateral width W7 because it is next to the necked part 4315.

The spacer 4121 may be formed along edges of the mandrel line 4205 on a second side opposite to the side the spacer 4141 is formed. The spacer 4121 may include a spacer segment 4123 next to the nominal part 4313, a spacer segment 4125 next to the necked part 4315, and a spacer segment 4127 next to the nominal part 4317. The spacer segment 4123 and the spacer segment 4127 may have a lateral width W8. The spacer segment 4125 may be wider than the lateral width W8 because it is next to the necked part 4315. In embodiments, the lateral width W7 may be at least twice the lateral width W8.

An empty space 4531 may be formed between the spacer 4061 and the spacer 4141. The empty space 4531 may have a width W13, which may be substantially the same as the width W9.

As shown in FIG. 4(c), the mandrel line 4201, the mandrel line 4203, and the mandrel line 4205 may be removed. An empty space 4431 may be created between the spacer 4081 and the spacer 4041 when the mandrel line 4201 is removed. An empty space 4411 may be created between the spacer 4021 and the spacer 4061 when the mandrel line 4203 is removed. Similarly, an empty space 4501 may be created between the spacer 4141 and the spacer 4121 when the mandrel line 4205 is removed. The empty space 4431, the empty space 4411, and the empty space 4501 formed by removing the mandrel lines, together with the empty space 4401 and the empty space 4531 formed between spacers, may be used to form fuse lines as shown in FIG. 4(d).

As shown in FIG. 4(d), a fuse line 4001 may be formed within the empty space 4401 between the spacer 4021 and the spacer 4041. A fuse line 4101 may be formed in the empty space 4501, which is the space occupied by the mandrel line 4205 before it is removed. In addition, more interconnect lines, e.g., an interconnect line 4031, an interconnect line 4011, and an interconnect line 4131 may be formed in the empty space 4431, the empty space 4411, and the empty space 4531. The interconnect line 4031, the interconnect line 4011, and the interconnect line 4131 may be parallel to the fuse line 4001 and the fuse line 4101.

The fuse line 4001 may include a nominal fuse segment 4003 formed within the nominal space 4303, a necked fuse segment 4005 formed within the narrower space 4305, and a nominal fuse segment 4007 formed within the nominal space 4307. The fuse line 4101 may include a nominal fuse segment 4103 in a space for the nominal part 4313 of the mandrel line 4205, a necked fuse segment 4105 in a space for the necked part 4315 of the mandrel line 4205, and a nominal fuse segment 4107 in a space for the nominal part 4317 of the mandrel line 4205. In embodiments, the nominal fuse segment 4103 may have a nominal lateral width W3, the necked fuse segment 4105 may have a necked lateral width W4, and the necked lateral width W4 may be in a range of 90% to 25% of the nominal lateral width W3, in embodiments, the nominal fuse segment 4003 may have the nominal lateral width W9, the necked fuse segment 4005 may have the necked lateral width W10, and the necked lateral width W10 may be in a range of 90% to 25% of the nominal lateral width W9.

As shown in FIG. 4(e), additional plugs may be formed on the interconnect lines in various positions. A plug 4163 may be formed on the interconnect line 4131 and may have a width W12. A plug 4085 may be formed on the interconnect line 4031 and may have a width W12.

A plug 4165 may be formed on the interconnect line 4131 and may have a width W11. A plug 4065 may be formed on the interconnect line 4011 and may have a width W11. The plug 4165 may be next to the spacer 4141, and the plug 4065 may be next to the spacer 4021. A part of the plug 4165 may overlaps with the necked fuse segment 4105 in a direction orthogonal to the necked fuse segment 4105. A part of the plug 4065 may overlap with the necked fuse segment 4005 in a direction orthogonal to the necked fuse segment 4005. The plug width W11 may be at least twice the plug width W12.

Figure 4:
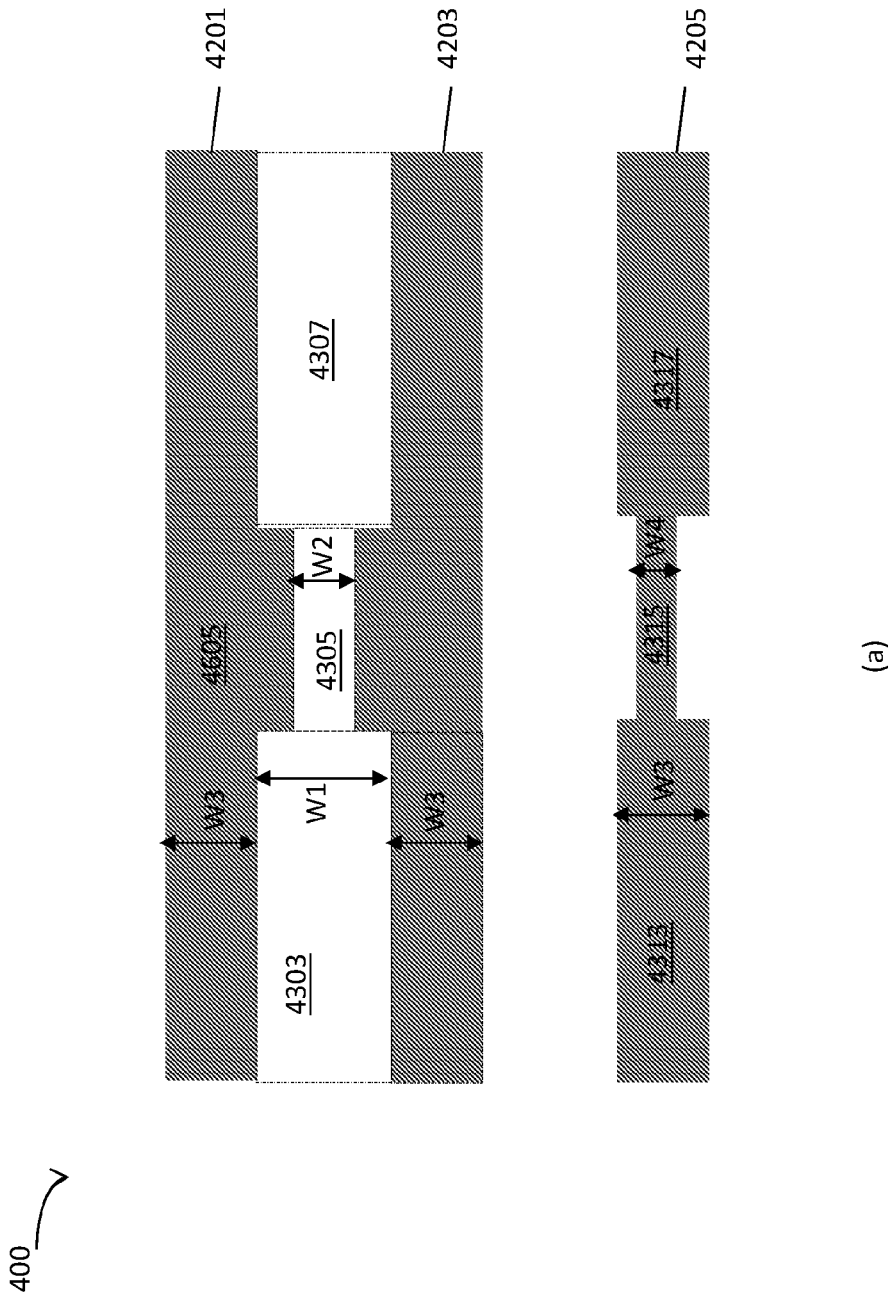
FIGS. 4(a)-4(e) schematically illustrate a process for forming an example semiconductor device including multiple fuse lines having a nominal fuse segment and a necked fuse segment between spacers, in accordance with some embodiments.
Figure 4:
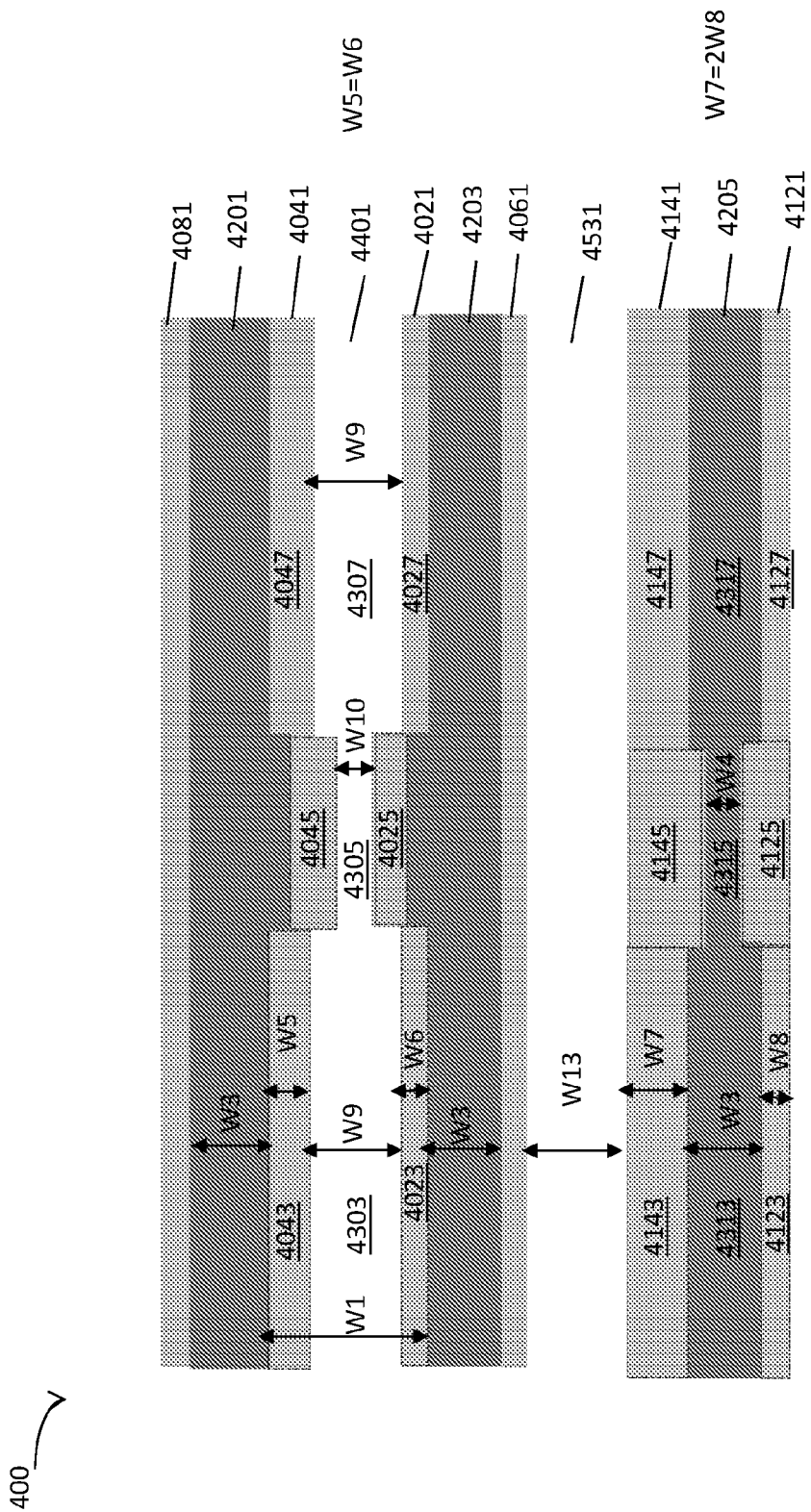
Figure 4:
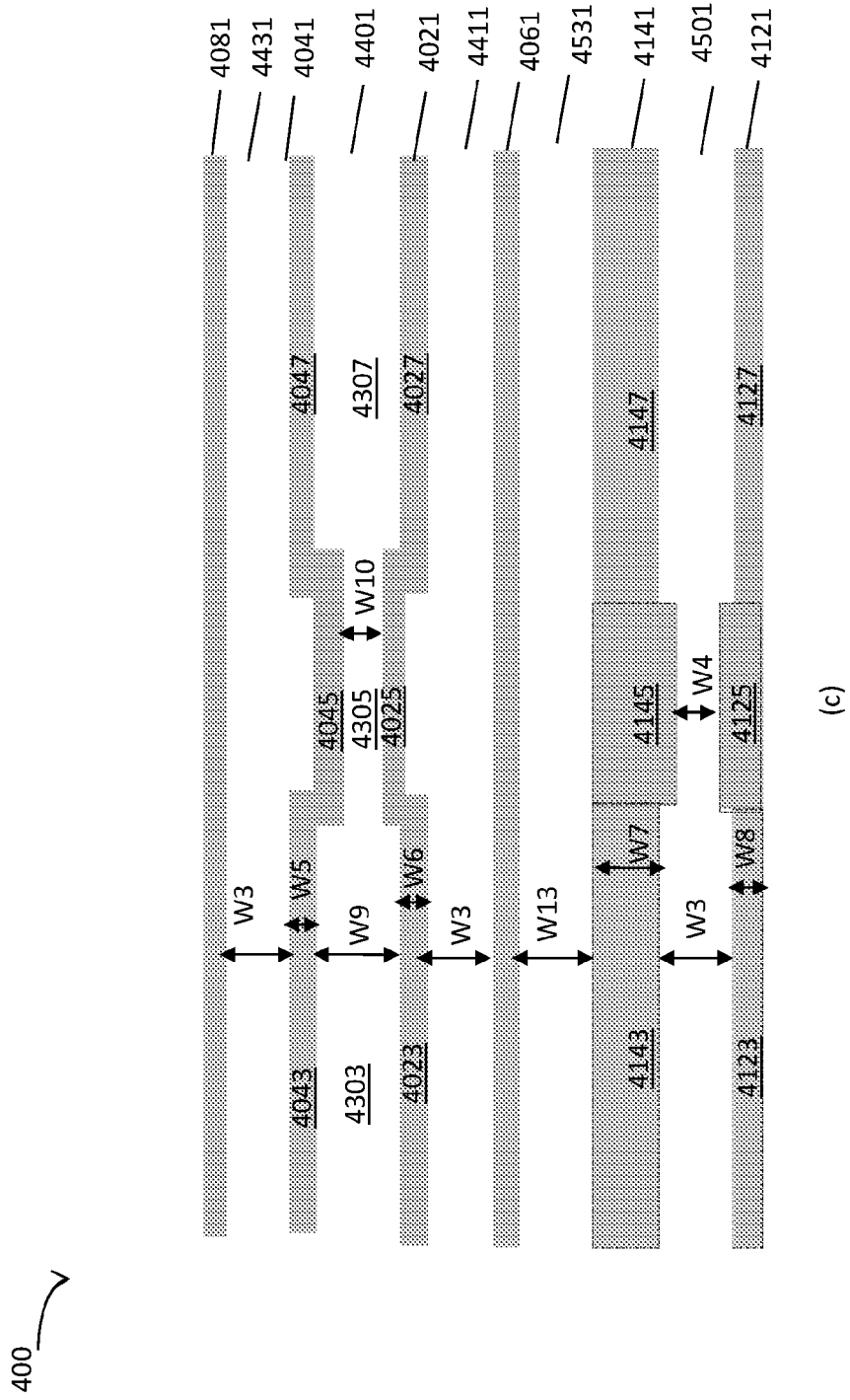
Figure 4:
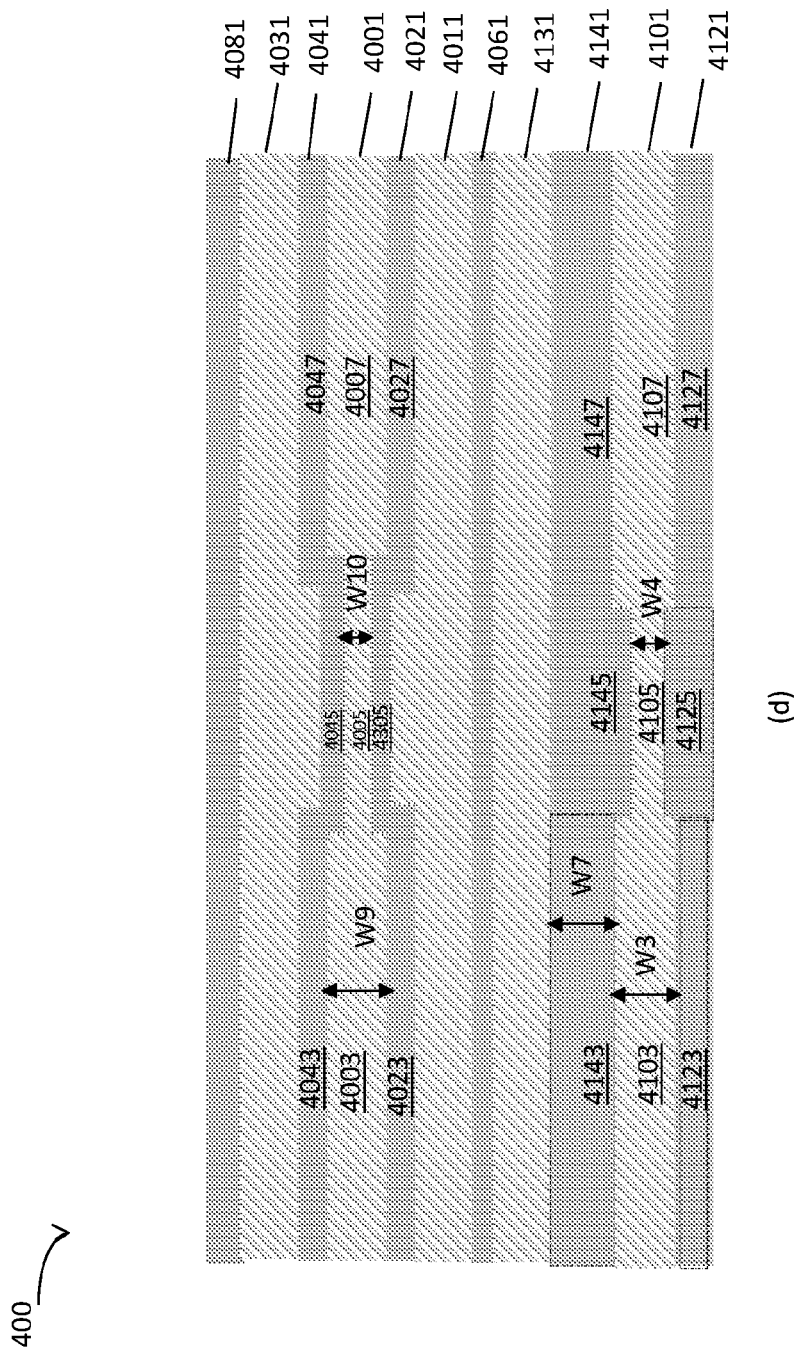
Figure 4:
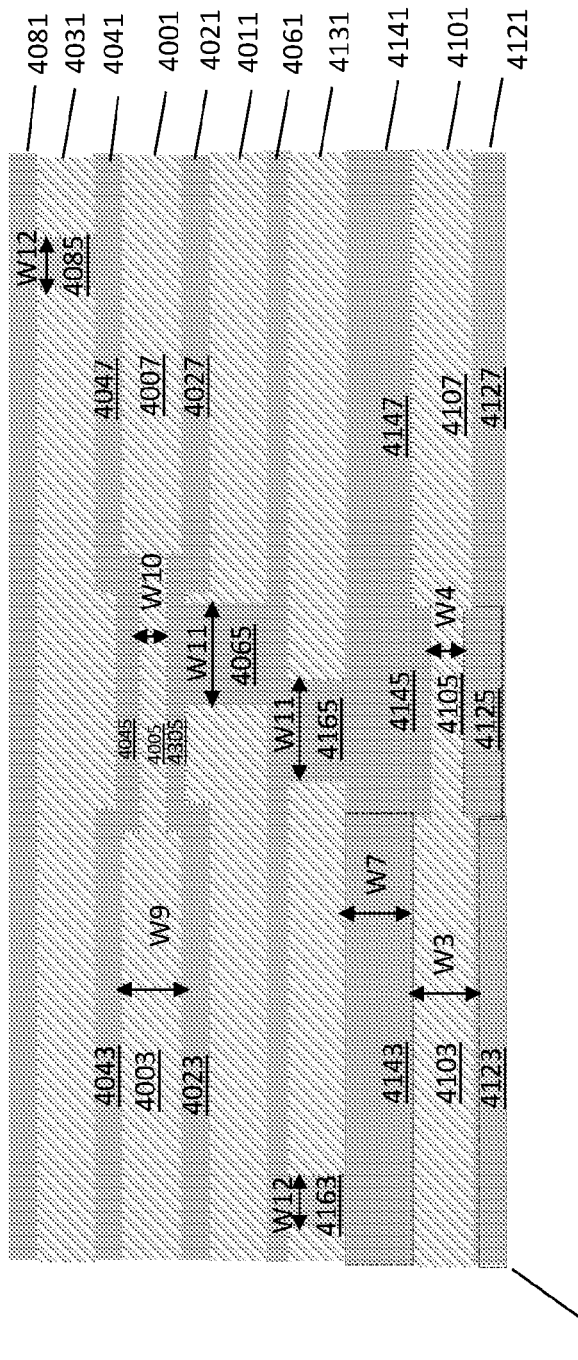
Figure 5:
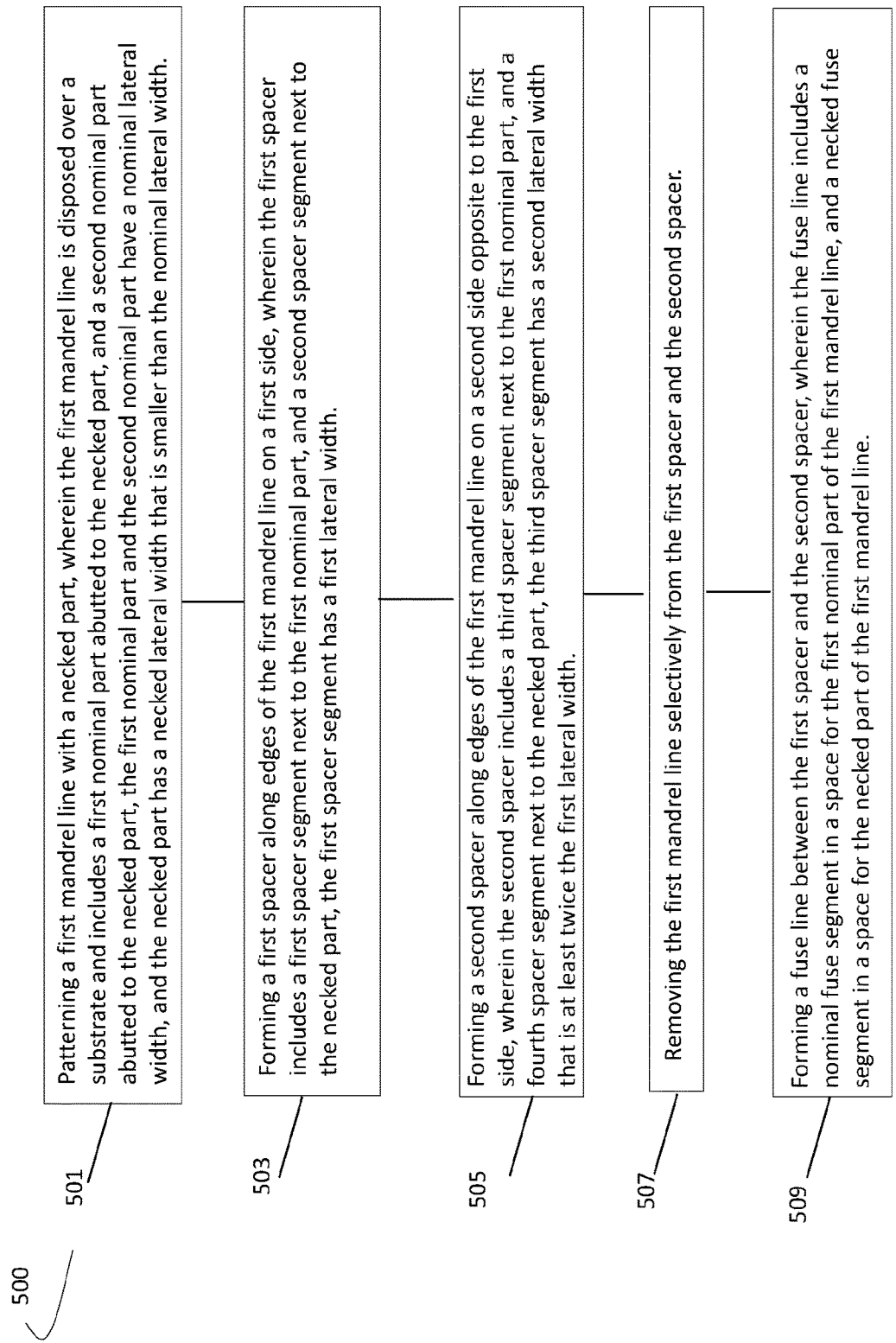
FIG. 5 schematically illustrates another process for forming an example semiconductor device including a fuse line having a nominal fuse segment and a necked fuse segment between spacers, in accordance with some embodiments.

FIG. 5 schematically illustrates another process 500 for forming an example semiconductor device including a fuse line having a nominal fuse segment and a necked fuse segment between spacers, in accordance with some embodiments. In embodiments, the process 500 may be applied to form the semiconductor device 100 as shown in FIG. 1, or the semiconductor device 300 as shown in FIG. 3. In embodiments, the process 500 may be an example of the process 400 shown in FIG. 4.

At block 501, the process 500 may include patterning a first mandrel line disposed over a substrate and the first mandrel line may have a necked part. The first mandrel line may also include a first nominal part abutted to the necked part, and a second nominal part abutted to the necked part. The first nominal part and the second nominal part may have a nominal lateral width, and the necked part may have a necked lateral width that is smaller than the nominal lateral width. For example, in embodiment, the process 500 may include forming the mandrel line 4205 as illustrated in FIG. 4(a). The mandrel line 4205 may include a necked part 4315, a nominal part 4313 abutted to the necked part 4315, and a nominal part 4317 abutted to the necked part 4315. The nominal part 4313 and the nominal part 4317 may have a nominal lateral width W3. In addition, the necked part 4315 may have a necked lateral width W4 that is smaller than the nominal lateral width W3.

At block 503, the process 500 may include forming a first spacer along edges of the first mandrel line on a first side. The first spacer may include a first spacer segment next to the first nominal part, and a second spacer segment next to the necked part, the first spacer segment has a first lateral width. For example, in embodiment, the process 500 may include forming the spacer 4121 along edges of the mandrel line 4205 as illustrated in FIG. 4(b). The spacer 4121 may include a spacer segment 4123 next to the nominal part 4313, and a spacer segment 4125 next to the necked part 4315. The spacer segment 4123 may have a lateral width W8.

At block 505, the process 500 may include forming a second spacer along edges of the first mandrel line on a second side opposite to the first side. The second spacer may include a third spacer segment next to the first nominal part, and a fourth spacer segment next to the necked part. The third spacer segment may have a second lateral width that is at least twice the first lateral width. For example, in embodiment, the process 500 may include forming the spacer 4141 along edges of the mandrel line 4205 on a second side opposite to the first side where the spacer 4121 is located, as illustrated in FIG. 4(b). The spacer 4141 may include a spacer segment 4143 next to the nominal part 4313, and a spacer segment 4145 next to the necked part 4315. The spacer segment 4143 may have a lateral width W7 that is at least twice the lateral width W8.

At block 507, the process 500 may include removing the first mandrel line selectively from the first spacer and the second spacer. For example, the process 500 may include removing the mandrel line 4205 selectively from the spacer 4141 and the spacer 4121, leaving the empty space 4501 to form a fuse line, as shown in FIG. 4(c).

At block 509, the process 500 may include forming a fuse line between the first spacer and the second spacer. The fuse line may include a nominal fuse segment in a space for the first nominal part of the first mandrel line, and a necked fuse segment in a space for the necked part of the first mandrel line. For example, the process 500 may include forming the fuse line 4101 between the spacer 4141 and the spacer 4121. The fuse line 4101 may include a nominal fuse segment 4103 in a space for the nominal part 4313 of the mandrel line 4205, and a necked fuse segment 4105 in a space for the necked part 4315 of the mandrel line 4205, as shown in FIG. 4(d).

Figure 6:
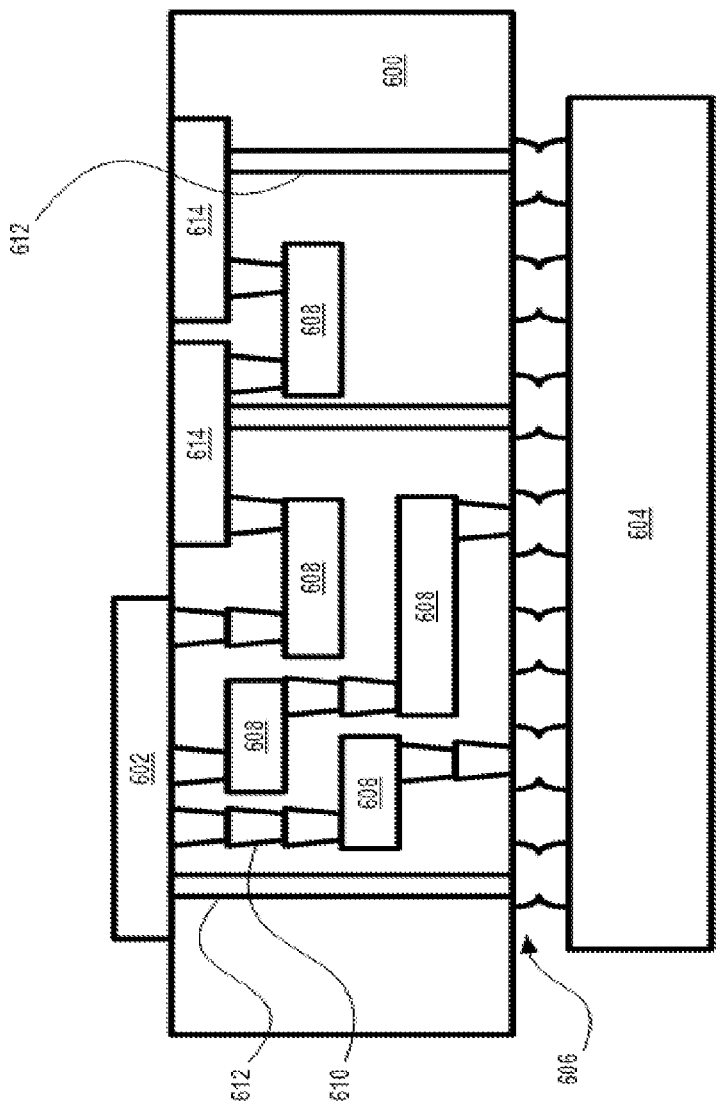
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die, including the semiconductor device 100 shown in FIG. 1, the semiconductor device 200 shown in FIG. 2(a), the semiconductor device 210 shown in FIG. 2(b), or the semiconductor device 300 shown in FIG. 3. For examples, the first substrate 602 may be an integrated circuit die including multiple fins having multiple cut regions with orthogonal corners on the multiple fins based on multiple masks formed by using sacrificial layers with embedded grating lines. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices, More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
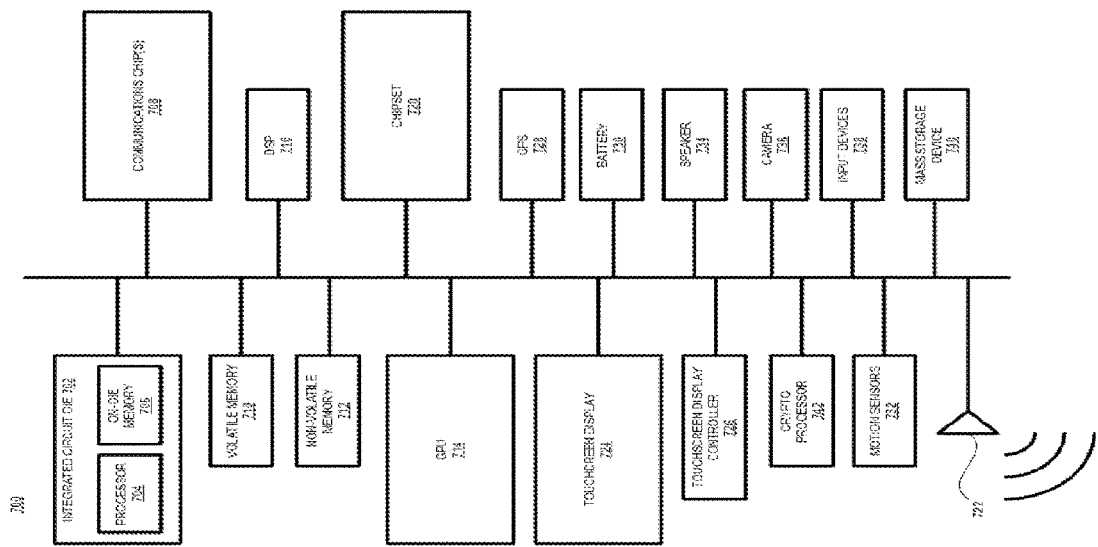
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit the 702. The integrated circuit the 702 may include a CPU 704 as well as on-die memory 706, often used as cache memory, which can be provided by technologies such as embedded DRAM (eDRAM), SRAM, or spin-transfer torque memory (STT-MRAM).

Computing device 700 may include other components that may or may not be physically and electrically coupled to the motherboard or fabricated within a SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (e.g., a specialized processor that executes cryptographic algorithms within hardware), a chipset 720, at least one antenna 722 (in some implementations two or more antenna may be used), a display or a touchscreen display 724, a touchscreen controller 726, a battery 728 or other power source, a power amplifier (not shown), a voltage regulator (not shown), a global positioning system (GPS) device 728, a compass 730, a motion coprocessor or sensors 732. (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX. (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LIE, Ev-DO, and others.

The processor 704 of the computing device 700 includes one or more devices, such as semiconductor devices, that are formed in accordance with embodiments of the current disclosure, e.g., the semiconductor device 100 shown in FIG. 1, the semiconductor device 200 shown in FIG. 2(a), the semiconductor device 210 shown in FIG. 2(b), the semiconductor device 300 shown in FIG. 3, a semiconductor device fabricated using the process 400 shown in FIG. 4, or a semiconductor device fabricated using the process 500 shown in FIG. 5. The term "processor" may refer to any device or portion of a device that processes electronic data from registers and/or memory to transform that electronic data into other electronic data that may be stored in registers and/or memory.

The communications logic unit 708 may also include one or more devices, such as semiconductor devices, that are formed in accordance with embodiments of the current disclosure, e.g., the semiconductor device 100 shown in FIG. 1, the semiconductor device 200 shown in FIG. 2(a), the semiconductor device 210 shown in FIG. 2(b), the semiconductor device 300 shown in FIG. 3, a semiconductor device fabricated using the process 400 shown in FIG. 4, or a semiconductor device fabricated using the process 500 shown in FIG. 5.

In further embodiments, another component housed within the computing device 700 may contain one or more devices, such as semiconductor devices, that are formed in accordance with implementations of the current disclosure, e.g., the semiconductor device 100 shown in FIG. 1, the semiconductor device 200 shown in FIG. 2(a), the semiconductor device 210 shown in FIG. 2(b), the semiconductor device 300 shown in FIG. 3, a semiconductor device fabricated using the process 400 shown in FIG. 4, or a semiconductor device fabricated using the process 500 shown in FIG. 5.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Some non-limiting Examples are provided below.

Example 1 may include a semiconductor device, comprising: a fuse line disposed over a substrate, wherein the fuse line includes a nominal fuse segment abutted to a necked fuse segment, the nominal fuse segment has a nominal lateral width, and the necked fuse segment has a necked lateral width that is smaller than the nominal lateral width; a first spacer along a first side of the fuse line, wherein the first spacer includes a first part of the first spacer that is next to the nominal fuse segment and has a first width; and a second spacer along a second side of the fuse line opposite to the first side of the fuse line, wherein the second spacer includes a first part of the second spacer that is next to the nominal fuse segment and has a second width, and the second width is at least twice the first width.

Example 2 may include the device of example 1 and/or some other examples herein, further comprising: a first plug of an interconnect line in parallel with the fuse line, wherein the first plug has a first plug width, and a second plug next to the first spacer or the second spacer, wherein at least a part of the second plug is located orthogonal to the necked fuse segment of the fuse line, the second plug has a second plug width, and the second plug width is at least twice the first plug width.

Example 3 may include the device of example 2 and/or some other examples herein, further comprising: a third plug next to the first spacer or the second spacer, wherein at least a part of the third plug is located orthogonal to the necked fuse segment of the fuse line, and the third plug has the second plug width.

Example 4 may include the device of example 1 and/or some other examples herein, wherein the first spacer further includes a second part of the first spacer that is next to the necked fuse segment, and the second spacer further includes a second part of the second spacer that is next to the necked fuse segment.

Example 5 may include the device of example 1 and/or some other examples herein, further comprising: a first interconnect line next to the first spacer in parallel to the fuse line; and a second interconnect line next to the second spacer in parallel to the fuse line.

Example 6 may include the device of any of examples 1-5 and/or some other examples herein, wherein the fuse line, the first spacer, and the second spacer together form a rectangle in top-down view.

Example 7 may include the device of any of examples 1-5 and/or some other examples herein, wherein the nominal lateral width is equal to a critical dimension for an interconnect line based on a design rule.

Example 8 may include the device of any of examples 1-5 and/or some other examples herein, wherein the necked lateral width is in a range of 90% to 25% of the nominal lateral width.

Example 9 may include the device of any of examples 1-5 and/or some other examples herein, wherein the first spacer includes one or more of silicon dioxide ($SiO_2$), silicon nitride ($Si_3N_4$), silicon oxynitride (SiON), a low-k material, or an ultra low-k material.

Example 10 may include the device of any of examples 1-5 and/or some other examples herein, wherein the fuse line includes one or more of copper (Cu), Tungsten (W), aluminum (Al), titanium (Ti), platinum (Pt), cobalt (Co), tantalum (Ta), or an alloy of Cu, W, Al, Ti, Pt, Co, or Ta.

Example 11 may include a semiconductor device, comprising: a fuse line disposed over a substrate, wherein the fuse line includes a nominal fuse segment abutted to a necked fuse segment, the nominal fuse segment has a nominal lateral width, and the necked fuse segment has a necked lateral width that is smaller than the nominal lateral width; a first spacer along a first side of the fuse line, wherein the first spacer includes a first part of the first spacer that is next to the nominal fuse segment; a second spacer along a second side of the fuse line opposite to the first side of the fuse line, wherein the second spacer includes a first part of the second spacer that is next to the nominal fuse segment; a first plug of an interconnect line in parallel with the fuse line, wherein the first plug has a first plug width; and a second plug next to the first spacer or the second spacer, wherein at least a part of the second plug is located orthogonal to the necked fuse segment of the fuse line, the second plug has a second plug width, and the second plug width is at least twice the first plug width.

Example 12 may include the device of example 11 and/or some other examples herein, wherein the first spacer further includes a second part of the first spacer that is next to the necked fuse segment, and the second spacer further includes a second part of the second spacer that is next to the necked fuse segment.

Example 13 may include the device of example 11 and/or some other examples herein, further comprising: a third plug next to the first spacer or the second spacer, wherein at least a part of the third plug is located orthogonal to the necked fuse segment of the fuse line, and the third plug has the second plug width.

Example 14 may include the device of example 11 and/or some other examples herein, wherein the first part of the first spacer has a first width, the first part of the second spacer has a second width, and the second width is at least twice the first width.

Example 15 may include the device of example 11 and/or some other examples herein, further comprising: a first interconnect line next to the first spacer in parallel to the fuse line; and a second interconnect line next to the second spacer in parallel to the fuse line.

Example 16 may include the device of any of examples 11-15 and/or some other examples herein, wherein the nominal lateral width is equal to a critical dimension for an interconnect line based on a design rule.

Example 17 may include the device of any of examples 11-15 and/or some other examples herein, wherein the necked lateral width is in a range of 90% to 25% of the nominal lateral width.

Example 18 may include the device of any of examples 11-15 and/or some other examples herein, wherein the first spacer includes one or more of silicon dioxide ($SiO_2$), silicon nitride ($Si_3N_4$), silicon oxynitride (SiON), a low-k material, or an ultra low-k material.

Example 19 may include the device of any of examples 11-15 and/or some other examples herein, wherein the fuse line includes one of copper (Cu), Tungsten (W), aluminum (Al), titanium. (Ti), platinum (Pt), cobalt (Co), tantalum (Ta), or an alloy of Cu, W, Al, Ti, Pt, Co, or Ta.

Example 20 may include a method of fabricating a fuse structure in a semiconductor device, the method comprising: patterning a first mandrel line with a necked part, wherein the first mandrel line is disposed over a substrate and includes a first nominal part abutted to the necked part, and a second nominal part abutted to the necked part, the first nominal part and the second nominal part have a nominal lateral width, and the necked part has a necked lateral width that is smaller than the nominal lateral width; forming a first spacer along edges of the first mandrel line on a first side, wherein the first spacer includes a first spacer segment next to the first nominal part, and a second spacer segment next to the necked part, the first spacer segment has a first lateral width; forming a second spacer along edges of the first mandrel line on a second side opposite to the first side, wherein the second spacer includes a third spacer segment next to the first nominal part, and a fourth spacer segment next to the necked part, the third spacer segment has a second lateral width that is at least twice the first lateral width; removing the first mandrel line selectively from the first spacer and the second spacer; and forming a fuse line between the first spacer and the second spacer, wherein the fuse line includes a nominal fuse segment in a space for the first nominal part of the first mandrel line, and a necked fuse segment in a space for the necked part of the first mandrel line.

Example 21 may include the method of example 20 and/or some other examples herein, further comprising: patterning a second mandrel line and a third mandrel line in parallel to the first mandrel line, wherein the second mandrel line and the third mandrel line form a narrower space, and a nominal space abutted to the narrower space that is wider than the narrower space; forming a third spacer along edges of the second mandrel line, wherein the third spacer includes a fifth spacer segment disposed within the nominal space and a sixth spacer segment disposed within the narrower space, and the fifth spacer segment and the sixth spacer segment have a third lateral width; forming a fourth spacer along edges of the third mandrel line, wherein the fourth spacer includes a seventh spacer segment disposed within the nominal space and an eighth spacer segment disposed within the narrower space, and the seventh spacer segment and the eighth spacer segment have the third lateral width; removing the second mandrel line selectively from the third spacer; removing the third mandrel fine selectively from the fourth spacer; and forming a second fuse line between the third spacer and the fourth spacer, wherein the second fuse line has a nominal fuse segment within the nominal space and a necked fuse segment within the narrower space.

Example 22 may include the method of example 20 and/or some other examples herein, further comprising: forming a first plug of an interconnect line, wherein the interconnect line is in parallel with the fuse line, and the first plug has a first plug width; and forming a second plug next to the first spacer or the second spacer, wherein the second plug has a second plug width that is at least twice the first plug width, and a part of the second plug overlaps with the necked fuse segment in a direction orthogonal to the necked fuse segment.

Example 23 may include the method of example 21 and/or some other examples herein, further comprising: forming a third plug of an interconnect line, wherein the interconnect line is in parallel with the second fuse line, and the third plug has a third plug width; and forming a fourth plug next to the third spacer or the fourth spacer, wherein the fourth plug has a forth plug width that is at least twice the third plug width, and a part of the fourth plug overlaps with the sixth spacer segment or the eighth spacer segment in a direction orthogonal to the necked fuse segment of the second fuse line.

Example 24 may include the method of any of examples 20-23 and/or some other examples herein, wherein the nominal fuse segment has the nominal lateral width, the necked fuse segment has the necked lateral width, and the necked lateral width is in a range of 90% to 25% of the nominal lateral width.

Example 25 may include the method of any of examples 20-23 and/or some other examples herein, wherein the first spacer includes one or more of silicon dioxide ($SiO_2$), silicon nitride ($Si_3N_4$), silicon oxynitride (SiON), a low-k material, or an ultra low-k material.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a fuse line disposed over a side of a substrate, wherein the fuse line includes a nominal fuse segment abutted to a necked fuse segment, the nominal fuse segment has a nominal lateral width, and the necked fuse segment has a necked lateral width that is smaller than the nominal lateral width, wherein the fuse line has a first side and a second side opposite the first side, wherein the first side is entirely within a first plane and the second side is entirely within a second plane, wherein the first plane and the second plane are substantially parallel to the side of the substrate;
   a first spacer along a first side of the fuse line, wherein the first spacer includes a first part of the first spacer that is next to the nominal fuse segment and has a first width; and
   a second spacer along a second side of the fuse line opposite to the first side of the fuse line, wherein the second spacer includes a first part of the second spacer that is next to the nominal fuse segment and has a second width, and the second width is at least twice the first width.

2. The device of claim 1, further comprising:
a first plug of an interconnect line in parallel with the fuse line, wherein the first plug has a first plug width; and
a second plug next to the first spacer or the second spacer, wherein at least a part of the second plug is located orthogonal to the necked fuse segment of the fuse line, the second plug has a second plug width, and the second plug width is at least twice the first plug width.

3. The device of claim 2, further comprising:
a third plug next to the first spacer or the second spacer, wherein at least a part of the third plug is located orthogonal to the necked fuse segment of the fuse line, and the third plug has the second plug width.

4. The device of claim 1, wherein the first spacer further includes a second part of the first spacer that is next to the necked fuse segment, and the second spacer further includes a second part of the second spacer that is next to the necked fuse segment.

5. The device of claim 1, further comprising:
a first interconnect line next to the first spacer in parallel to the fuse line; and
a second interconnect line next to the second spacer in parallel to the fuse line.

6. The device of claim 1, wherein the fuse line, the first spacer, and the second spacer together form a rectangle in top-down view.

7. The device of claim 1, wherein the nominal lateral width is equal to a critical dimension for an interconnect line based on a design rule.

8. The device of claim 1, wherein the necked lateral width is in a range of 90% to 25% of the nominal lateral width.

9. The device of claim 1, wherein the first spacer includes one or more of silicon dioxide ($SiO_2$), silicon nitride ($Si_3N_4$), silicon oxynitride (SiON), a low-k material, or an ultra low-k material.

10. The device of claim 1, wherein the fuse line includes one or more of copper (Cu), Tungsten (W), aluminum (Al), titanium (Ti), platinum (Pt), cobalt (Co), tantalum (Ta), or an alloy of Cu, W, Al, Ti, Pt, Co, or Ta.

11. A semiconductor device, comprising:
a fuse line disposed over a side of a substrate, wherein the fuse line includes a nominal fuse segment abutted to a necked fuse segment, the nominal fuse segment has a nominal lateral width, and the necked fuse segment has a necked lateral width that is smaller than the nominal lateral width, wherein the fuse line has a first side and a second side opposite the first side, wherein the first side is entirely within a first plane and the second side is entirely within a second plane, wherein the first plane and the second plane are substantially parallel to the side of the substrate;
a first spacer along a first side of the fuse line, wherein the first spacer includes a first part of the first spacer that is next to the nominal fuse segment;
a second spacer along a second side of the fuse line opposite to the first side of the fuse line, wherein the second spacer includes a first part of the second spacer that is next to the nominal fuse segment;
a first plug of an interconnect line in parallel with the fuse line, wherein the first plug has a first plug width; and
a second plug next to the first spacer or the second spacer, wherein at least a part of the second plug is located orthogonal to the necked fuse segment of the fuse line, the second plug has a second plug width, and the second plug width is at least twice the first plug width.

12. The device of claim 11, wherein the first spacer further includes a second part of the first spacer that is next to the necked fuse segment, and the second spacer further includes a second part of the second spacer that is next to the necked fuse segment.

13. The device of claim 11, further comprising:
a third plug next to the first spacer or the second spacer, wherein at least a part of the third plug is located orthogonal to the necked fuse segment of the fuse line, and the third plug has the second plug width.

14. The device of claim 11, wherein the first part of the first spacer has a first width, the first part of the second spacer has a second width, and the second width is at least twice the first width.

15. The device of claim 11, further comprising:
a first interconnect line next to the first spacer in parallel to the fuse line; and
a second interconnect line next to the second spacer in parallel to the fuse line.

16. The device of claim 11, wherein the nominal lateral width is equal to a critical dimension for an interconnect line based on a design rule.

17. The device of claim 11, wherein the necked lateral width is in a range of 90% to 25% of the nominal lateral width.

18. The device of claim 11, wherein the first spacer includes one or more of silicon dioxide ($SiO_2$), silicon nitride ($Si_3N_4$), silicon oxynitride (SiON), a low-k material, or an ultra low-k material.

19. The device of claim 11, wherein the fuse line includes one of copper (Cu), Tungsten (W), aluminum (Al), titanium (Ti), platinum (Pt), cobalt (Co), tantalum (Ta), or an alloy of Cu, W, Al, Ti, Pt, Co, or Ta.

* * * * *